United States Patent
Tatsuki et al.

(10) Patent No.: US 6,780,692 B2
(45) Date of Patent: Aug. 24, 2004

(54) LASER ANNEALING APPARATUS AND METHOD OF FABRICATING THIN FILM TRANSISTOR

(75) Inventors: Koichi Tatsuki, Kanagawa (JP); Koichi Tsukihara, Tokyo (JP); Naoya Eguchi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/215,049

(22) Filed: Aug. 8, 2002

(65) Prior Publication Data

US 2003/0042397 A1 Mar. 6, 2003

(30) Foreign Application Priority Data

Aug. 9, 2001 (JP) ........................................ 2001-242774

(51) Int. Cl.⁷ .......................... H01L 21/00; H01L 21/84
(52) U.S. Cl. ...................... 438/166; 438/150; 438/149
(58) Field of Search .................................. 438/149–166

(56) References Cited

U.S. PATENT DOCUMENTS

| | | | | |
|---|---|---|---|---|
| 6,014,401 A | * | 1/2000 | Godard et al. ................. 372/97 |
| 6,380,011 B1 | * | 4/2002 | Yamazaki et al. ............. 438/163 |
| 6,451,631 B1 | * | 9/2002 | Grigoropoulos et al. ...... 438/149 |
| 6,455,359 B1 | * | 9/2002 | Yamazaki et al. ............. 438/166 |
| 6,521,473 B1 | * | 2/2003 | Jung .............................. 438/30 |
| 2003/0021307 A1 | * | 1/2003 | Yamazaki ...................... 372/24 |

* cited by examiner

Primary Examiner—John F. Niebling
Assistant Examiner—Jennifer M. Kennedy
(74) Attorney, Agent, or Firm—Robert J. Depke; Holland & Knight LLP

(57) ABSTRACT

In a method of fabricating a thin film transistor through conversion of an amorphous silicon film into a polysilicon film to be an active layer of the thin film transistor by a laser annealing treatment, a laser annealing apparatus comprising a plurality of semiconductor laser devices arranged performs the laser annealing treatment by irradiating the surface of the amorphous silicon film with laser light uniformized in the light intensity of the laser light radiated onto the surface of the amorphous silicon film, whereby the crystal grain diameter of the polysilicon film obtained through recrystallization is uniformized, and it is possible to obtain a thin film transistor with transistor characteristics enhanced by using the polysilicon film as the active layer.

6 Claims, 8 Drawing Sheets

LASER ANNEALING APPARATUS AND METHOD OF FABRICATING THIN FILM TRANSISTOR

This application claims priority to Japanese Patent Application Number JP2001-242774 filed Aug. 9, 2001 which is incorporated herein by reference.

BACKGROUND OF THE INVENTION

The present invention relates to a laser annealing apparatus for applying an annealing treatment to a material by irradiating the surface of the material with laser light, and a method of fabricating a thin film transistor by converting an amorphous silicon film to a polycrystalline silicon film which becomes an active layer of the thin film transistor through an annealing treatment.

The thin film transistor is widely used as a switching device in a liquid crystal display. Where polycrystalline silicon (hereinafter referred to as polysilicon) film is used as a channel layer in the thin film transistor, the electrolytic mobility of the thin film transistor is very high, so that the thin film transistor can be incorporated, for example, as a driving circuit in a liquid crystal display, and it is possible to realize higher definition, smaller size and the like of the display.

In addition, the thin film transistor using a polysilicon film as the channel layer has a higher driving current, as compared with the case where an amorphous silicon film is used as the channel layer, so that the thin film transistor can be applied to a pixel transistor in an organic electroluminescence (hereinafter abbreviated to EL) display utilizing EL of an organic material using a current driving system.

As a method for forming a polysilicon film on an insulating substrate, there is a method of converting an amorphous silicon film formed on the surface of an insulating substrate formed of, for example, glass, quartz, etc. into a polysilicon film by subjecting the amorphous silicon film to a laser annealing treatment through irradiation with laser light by use of a laser annealing apparatus.

The laser annealing apparatus used for the laser annealing treatment uses an excimer laser as a light source of the laser light. The excimer laser emits laser light at an ultraviolet wavelength in a pulsed state, and, since silicon has a high absorption coefficient for the laser light at the ultraviolet wavelength emitted in the pulsed state, an efficient laser annealing treatment of an amorphous silicon film can be achieved.

The laser annealing treatment is conducted in such a manner that the laser light emitted from the excimer laser is processed by, for example, a beam homogenizer to form the irradiation plane relative to the amorphous silicon surface into a linear form, and the amorphous silicon is polycrystallized into polysilicon while moving the irradiation region of the laser light. At the time of performing the laser annealing treatment, the laser light is scanned in a direction orthogonal to the longitudinal direction of the irradiation plane of the laser light formed in the linear form.

In the laser annealing apparatus described above, however, the pulsed emission of the laser light from the excimer laser is performed through excitation of an excitable gas such as XeCl and KrF, so that the emission of the laser light will easily become unstable attendant on deterioration of the excitable gas, and the light intensity of the laser light on a pulse basis may be dispersed.

In this laser annealing apparatus, therefore, the laser annealing treatment of the amorphous silicon film is conducted with the laser light dispersed in light intensity, resulting in a laser annealing treatment in which the heated and molten state of the amorphous silicon film is dispersed.

Therefore, with the amorphous silicon film of which the heated and molten state is dispersed, the grain size of crystal grains in the polysilicon film obtained through recrystallization is dispersed. Thus, there has been the problem that nonuniformity in the form of, for example, streaks or spots, is generated in the picture formed by display devices, and transistor characteristics are deteriorated.

In addition, in the laser annealing apparatus as above, the step of gas replacement attendant on the deterioration of the excitable gas used in the excimer laser leads to a lowering in productivity and an increase in the cost of production of the thin film transistor.

Furthermore, the laser annealing apparatus needs a tank for storing the excitable gas, and is large in the size of equipment. Therefore, the laser annealing apparatus leads to a large installation area and a large power consumption, resulting in an increase in the cost of production of the thin film transistor.

SUMMARY OF THE INVENTION

The present invention has been proposed in consideration of the above situations. Accordingly, it is an object of the present invention to provide a laser annealing apparatus capable of an annealing treatment with stable light intensity, and a method of fabricating a thin film transistor which makes it possible to enhance transistor characteristics, to enhance productivity and to reduce production cost by using a polycrystalline silicon film obtained through the annealing treatment by laser light with the stable light intensity.

In accordance with one aspect of the present invention, there is provided a laser annealing apparatus for subjecting a material to an annealing treatment by irradiating the surface of the material with laser light, comprising a plurality of semiconductor laser devices for emitting laser light toward the material, and unformizing means for uniformizing the light intensity of the laser light emitted from the plurality of semiconductor laser devices and radiated to the surface of the material.

In the laser annealing apparatus, the laser light emitted from the plurality of semiconductor laser devices is processed by the uniformizing means so that the light intensity of the laser light with which the surface of the material is irradiated is uniformized, to that it is possible to subject the material to an annealing treatment by the laser light with a stable light intensity.

According to the present invention, therefore, dispersion of the heated and molten state of the amorphous silicon film can be restrained, the grain diameter of crystal grains of the polycrystalline silicon film recrystallized from the amorphous silicon film is uniformized, and transistor characteristics of the thin film transistor comprising the polycrystalline silicon film as an active layer can be enhanced.

In accordance with another aspect of the present invention, there is provided a method of fabricating a thin film transistor which comprises a first step of forming an amorphous silicon film on a substrate, a second step of subjecting the amorphous silicon film to an annealing treatment to thereby convert the amorphous silicon film into a polycrystalline silicon film, and a third step of laminatingly fabricating the thin film transistor in a predetermined region with the polycrystalline silicon film as an active layer. In the method of fabricating a thin film transistor, in the second step, the laser annealing apparatus comprising a plurality of semiconductor laser devices for emitting laser light subjects the surface of the amorphous silicon film to the annealing treatment while uniformizing the light intensity of the laser light radiated onto the surface of the amorphous silicon film by uniformizing means for uniformizing the light intensity of the laser light radiated onto the surface of the amorphous silicon film, whereby the amorphous silicon film is heated, melted and recrystallized to be thereby converted into the polycrystalline silicon film.

According to the method of fabricating a thin film transistor, the laser annealing apparatus subjects the amorphous silicon film to the annealing treatment while processing the laser light emitted from the plurality of semiconductor laser devices by the uniformizing means so as to uniformize the light intensity of the laser light with which the surface of the amorphous silicon film is irradiated. Therefore, dispersion of the heated and molten state of the amorphous silicon film is restrained, the grain diameter of the crystal grains of the polycrystalline silicon film recrystallized from the amorphous silicon film is uniformized, and a thin film transistor with enhanced transistor characteristics can be obtained.

The above and other objects, features and advantages of the present invention will become apparent from the following description and appended claims, taken in conjunction with the accompanying drawings which show by way of example some preferred embodiments of the invention.

DESCRIPTION OF THE PREFERRED EMBODIMENTS

Now, as an embodiment of the present invention, a laser annealing apparatus and a method of fabricating a thin film transistor according to the present invention will be described.

The laser annealing apparatus according to the embodiment of the present invention is used for a laser annealing treatment applied to an amorphous silicon film at the time of converting the amorphous silicon film into a crystalline silicon (hereinafter referred to as polysilicon) film through heating, melting and recrystallization by a laser annealing treatment of the amorphous silicon film in the fabrication process of, for example, a thin film transistor (hereinafter referred to as TFT). The TFT has a structure in which a gate electrode, a gate insulator, and a polysilicon film (channel layer) are sequentially laminated on, for example, a glass substrate from the lower side. Namely, the TFT has a bottom gate structure in which the gate electrode is provided between the polysilicon film, which functions as a channel layer, and the glass substrate.

A concrete constitution and a method of fabrication of the TFT having the above-mentioned structure will be described referring to FIG. 1.

Figure 1:
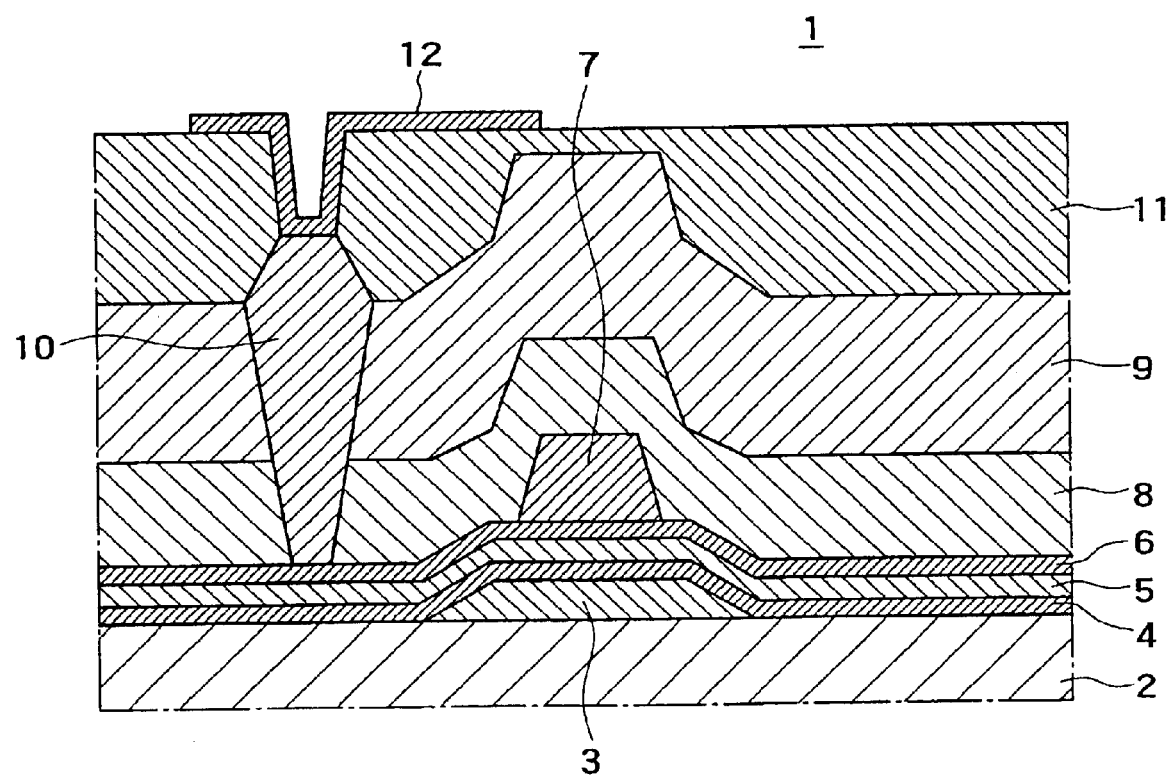
FIG. 1 illustrates a schematic sectional structure of a thin film transistor.

As shown in FIG. 1, the TFT 1 has a constitution in which the gate electrode 3, a first gate insulation film 4, a second gate insulation film 5, the polysilicon film 6, a stopper 7, a first inter-layer insulation film 8, a second inter-layer insulation film 9, a wiring 10, a planarizing film 11, and a transparent conductive film 12 are laminated on the glass substrate 2.

In fabricating the TFT 1 constituted as above, first, a metallic film of, for example, molybdenum (Mo), aluminum (Al), tantalum (Ta), titanium (Ti), chromium (Cr), tungsten (W) is formed on the glass substrate 2, and the metallic film is patterned by anisotropic etching to form the gate electrode 3.

Next, the first gate insulation film 4 formed of, for example, silicon nitride ($SiN_x$) is laminated on the glass substrate 2 provided thereon with the gate electrode 3.

Subsequently, the second gate insulation film 5 formed of, for example, silicon dioxide ($SiO_2$) is laminated on the first gate insulation film 4.

Next, the polysilicon film 6 formed of polysilicon, for example, is laminated on the second gate insulation film 5. The polysilicon film 6 functions as a channel layer of a bottom gate type TFT 1, and is formed by forming an amorphous silicon film by, for example, an LPCVD method, and then subjecting the amorphous silicon film to a laser annealing treatment by irradiating the amorphous silicon with laser light, thereby heating, melting and recrystallizing the amorphous silicon film to convert it into a polycrystalline film.

Figure 2:
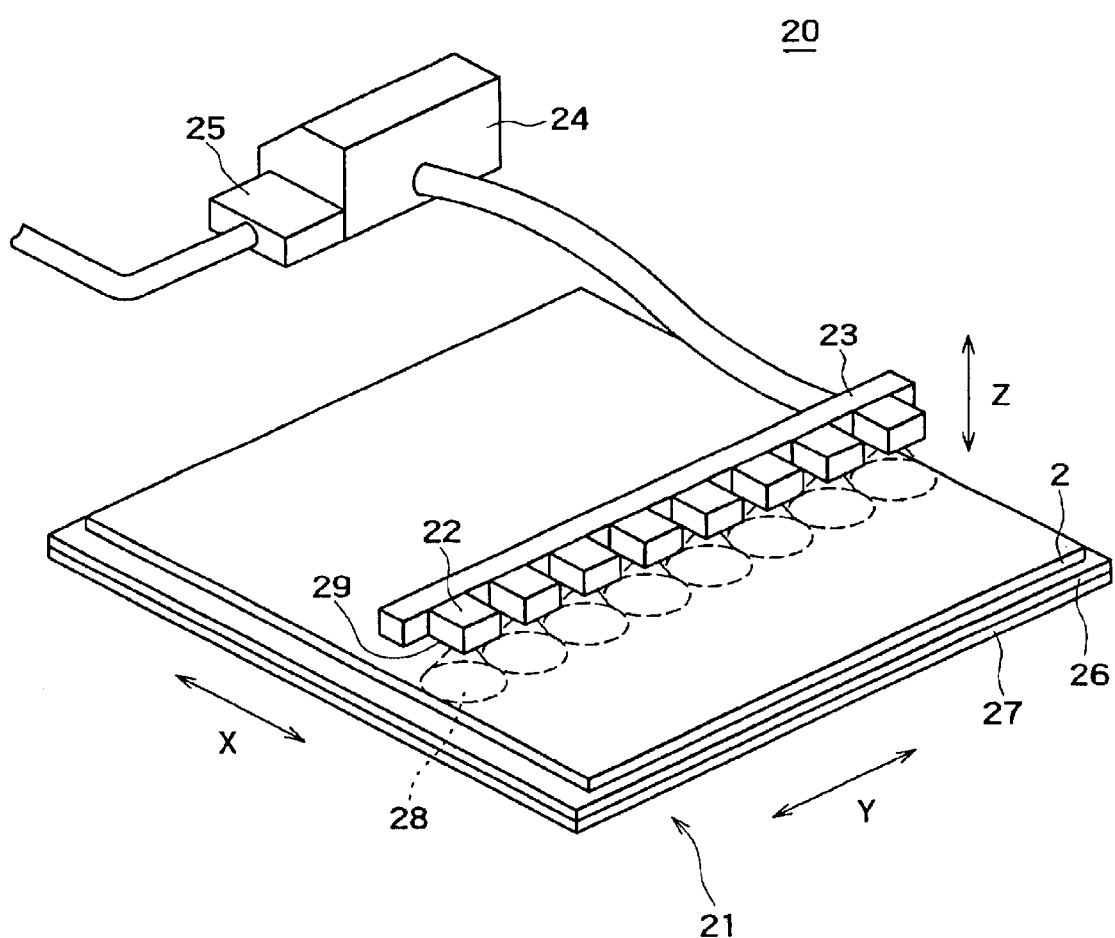
FIG. 2 is a general perspective view for illustrating the constitution of a laser annealing apparatus according to one embodiment of the present invention.

In the step of polycrystallization for obtaining the polysilicon film 6, the laser annealing treatment for heating and melting the amorphous silicon film is conducted by use of a laser annealing apparatus 20 shown in FIG. 2.

The laser annealing apparatus 20 used in the present embodiment is comprised of a moving stage 21, semiconductor laser devices 22, a support base 23, a control computer 24, and a power source 25.

The moving stage 21 is a mount base for mounting on its main surface the glass substrate 2 provided thereon with the amorphous silicon film to be subjected to the laser annealing treatment. The moving stage 21 is high in flatness of its main surface on which to mount the glass substrate 2, and has the function of moving the glass substrate 2 mounted thereon to the position for the laser annealing treatment and the function of fixing the glass substrate 2.

In concrete, the moving stage 21 is comprised of an X stage 26, a Y stage 27, and a sucker mechanism which is not shown. The X stage 26 and the Y stage 27 are stages for horizontally moving the moving stage 21 in the directions of arrow X and arrow Y in the figure in the plane of the main surface of the moving stage 21, whereby the glass substrate 2 mounted on the moving stage 21 is moved in mutually roughly orthogonal directions and led to the position for the laser annealing treatment. The sucker mechanism is for fixing the glass substrate 2 by sucking the glass substrate 2 onto the main surface of the moving stage 21.

The semiconductor laser devices 22 are laser light sources each of which comprises an emitting portion 29 for emitting laser light 28 for performing the laser annealing treatment of the amorphous silicon film, and in which a compound semiconductor of, for example, GaN, GaAs is used as an active layer. The semiconductor laser device 22 is not limited to the one in which the compound semiconductor of GaN, GaAs or the like is used as the active layer. For example, compound semiconductors obtained by synthesizing a compound comprised of any one or a plurality of elements selected from the group consisting of Ga, Al, and In with a compound comprised of any one or a plurality of elements selected from the group consisting of N, As, P, Zn, Se, Mg, Cd, and S may also be used as the active layer in the semiconductor laser device 22. Besides, in the semiconductor laser device 22, a compound semiconductor comprising SiC or diamond as a main constituent may be used as the active layer.

The support base 23 supports the plurality of semiconductor laser devices 22 in series at predetermined intervals on the surface of the amorphous silicon film so that the emitting portions 29 for emitting the laser light 28 and the surface of the amorphous silicon film are opposed in parallel to each other. In addition, the support base 23 comprises a lift mechanism which is not shown so that the semiconductor laser devices 22 supported thereon are vertically moved up and down as arrows Z in the figure relative to the moving stage 21. The lift mechanism is capable of regulating the distance between the plurality of semiconductor laser devices 22 and the surface of the amorphous silicon film, whereby the light intensity of the laser light 28 emitted from the plurality of semiconductor laser devices 22 and radiated onto the surface of the amorphous silicon film is varied.

The control computer 24 performs, for example, control of movement of the moving stage 21, control of emission of the laser light 28 at the semiconductor laser devices 22, control of the lift mechanism of the support base 23, and the like.

The power source 25 supplies, for example, electric power for emission of the laser light 28 from the semiconductor laser devices 22, and electric power for operating the control computer 24, to the semiconductor laser devices 22 and the control computer 24 and the like.

In the laser annealing apparatus 20 constituted as above, the laser light 28 emitted from the plurality of semiconductor laser devices 22 is radiated onto the surface of the amorphous silicon film in such a manner that the light intensity of the laser light 28 is uniformized.

As the conditions for uniformizing the light intensity of the laser light 28 with which the surface of the amorphous silicon film is irradiated, there may be mentioned, for example, the condition where the plurality of semiconductor laser devices 22 are supported on the support base 23 so that the distances between the emitting portions 29 of the plurality of semiconductor laser devices 22 and the surface of the amorphous silicon film are constant, the condition where the plurality of the semiconductor laser devices 22 are arranged on the support base 23 at such intervals that the laser light 28 radiated onto the surface of the amorphous silicon film does not contain overlaps of beams or gaps between beams, and the condition where the laser light 28 is emitted from the plurality of semiconductor laser devices 22 at the same light intensity.

By this, in the laser annealing apparatus 20, the light intensity of the laser light 28 emitted from the plurality of semiconductor laser devices 22 and radiated onto the surface of the amorphous silicon film is uniformized, and the amorphous silicon film is irradiated with the laser light 28 with the stable light intensity, so that the amorphous silicon film can be heated and melted without dispersion.

At the time of forming the polysilicon film 6 by use of the above-described laser annealing apparatus 20, first, the glass substrate 2 provided thereon with the amorphous silicon film is mounted on the moving stage 21.

Next, the lift mechanism of the support base 23 supporting the plurality of semiconductor laser devices 22 thereon moves the support base 23 up or down relative to the moving stage 21, thereby regulating the distance between the plurality of semiconductor laser devices 22 and the surface of the amorphous silicon film. By this, the light intensity of the laser light 28 emitted from the plurality of semiconductor laser devices 22 and radiated onto the surface of the amorphous silicon film can be regulated to a desired intensity.

Subsequently, the laser light emitted from the plurality of semiconductor laser devices 22 is radiated onto the surface of the amorphous silicon film, and the moving stage 21 is brought into a parallel movement in a direction roughly orthogonal to the direction in which the plurality of semiconductor laser devices 22 are arranged in series, whereby a laser annealing treatment for polycrystallizing the amorphous silicon film into the polysilicon film 6 is performed while moving the irradiation region of the laser light 28.

By performing the laser annealing treatment by irradiating the surface of the amorphous silicon film with the laser light 28 uniformized in the light intensity of the laser light 28 radiated onto the surface of the amorphous silicon film in the above-mentioned manner, dispersion of the heated and molten state of the amorphous silicon film is restrained, and the polysilicon film 6 uniformized in the grain diameter of crystal grains obtained through recrystallization is formed.

Next, as shown in FIG. 1, a film of, for example, silicon dioxide ($SiO_2$) is formed on the polysilicon film 6 formed in the above-mentioned manner, and the film of silicon dioxide ($SiO_2$) is patterned, for example, by the same patterning method as that used for forming the gate electrode 3, whereby a stopper 7 is formed at a position corresponding to the gate electrode 3.

Subsequently, the polysilicon film 6 is doped with ions of an impurity for forming source/drain regions. At this time, the stopper 7 prevents the polysilicon film 6 on the upper side of the gate electrode 3 from being doped with the ions of the impurity.

Next, a first inter-layer insulation film 8 formed of, for example, silicon dioxide ($SiO_2$) is laminated on the polysilicon film 6 provided with the stopper 7.

Subsequently, a second inter-layer insulation film 9 formed of, for example, silicon nitride ($SiN_x$) is laminated on the first inter-layer insulation film 8.

Next, contact holes for connecting the source/drain regions of the polysilicon film 6 are opened, a metallic film of, for example, aluminum (Al), titanium (Ti) is formed, and the metallic film is patterned by etching to form a wiring 10. The wiring 10 connects the source/drain regions of each transistor formed on the polysilicon film 6, and forms a predetermined circuit pattern on the substrate.

Subsequently, a planarizing film 11 formed of, for example, an acrylic resin for planarizing the surface of the bottom gate type TFT 1 is formed on the second interlayer insulation film 9 provided with the wiring 10.

Next, a transparent conductive film 12 formed of, for example, ITO for connecting the wiring 10 to external terminals or external wirings present in the exterior is formed on the planarizing film 11 after the planarizing film 11 is provided with contact holes. In the above-described manner, the TFT 1 is fabricated.

In the method of fabricating the TFT 1 as described above, the laser annealing apparatus 20 performs the laser annealing treatment by irradiating the surface of the amorphous silicon film with the laser light 28 uniformized in the light intensity of the laser light 28 radiated onto the surface of the amorphous silicon film, so that dispersion of the heated and molten state of the amorphous silicon film is restrained, and a TFT 1 uniformized in the grain diameter of crystal grains of the polysilicon film 6 recrsytallized from the amorphous silicon film can be obtained. In the TFT 1 obtained in this manner, the grain diameter of the crystal grains of the polysilicon film 6 is uniformized, so that generation of nonuniformity in the form of, for example, streaks or spots in the pictures of display devices is prevented, and transistor characteristics can be enhanced.

In addition, in the method of fabricating the TFT 1 as described above, the laser annealing apparatus 20 does not require an excitable gas as in a laser annealing apparatus using a conventional excimer laser, so that the risk that the light intensity of the emitted laser light becomes unstable due to deterioration of the excitable gas is obviated, and the surface of the amorphous silicon film can be irradiated with the laser light 28 with stable light intensity. Therefore, in the above-described method of fabricating the TFT 1, the laser annealing apparatus 20 can subject the amorphous silicon film to a laser annealing treatment in which dispersion of heating and melting is restrained by the laser light 28 with stable light intensity, and the yield in forming the polysilicon film 6 can be enhanced.

Further, in this method of fabricating the TFT 1, the laser annealing apparatus 20 does not need an excitable gas as in the case of a conventional laser annealing apparatus using an excimer laser, so that the step of replacing the deteriorated excitable gas is not needed, and enhancement of productivity of the TFT 1 can be contrived.

Furthermore, in this method of fabricating the TFT 1, the laser annealing apparatus 20 does not need a tank for reserving the excitable gas as in the case of a conventional laser annealing apparatus using an excimer laser, and the semiconductor laser devices 22 for emitting the laser light 28 are comparative small in size, so that installation area can be reduced, power consumption can be suppressed, and production cost of the TFT 1 can be reduced.

In the laser annealing apparatus 20 according to the embodiment of the present invention as described above, in performing the laser annealing treatment of silicon, it is preferable that the semiconductor laser devices 22 emit the laser light 28 with a wavelength in the range of 200 to 900 nm, more preferably the laser light 28 with a wavelength of about 400 nm.

The reason is as follows. Where the wavelength of the laser light 28 in the laser annealing treatment of silicon is shorter than 200 nm, in the laser annealing apparatus 20, the laser light 28 is absorbed by, for example, the atmospheric air, and the light intensity of the laser light 28 radiated onto the surface of the amorphous silicon film is lowered, so that the efficiency of the laser annealing treatment of the amorphous silicon film may be lowered.

On the other hand, where the wavelength of the laser light 28 in the laser annealing treatment of silicon is longer than 900 nm, in the laser annealing apparatus 20, the absorption efficiency of the amorphous silicon film for the laser light 28 is as extremely low as not more than 0.1, so that the efficiency of the laser annealing treatment of the amorphous silicon film may be lowered.

Therefore, in the laser annealing apparatus 20, in performing the laser annealing treatment of silicon, the semiconductor laser devices 22 emit the laser light 28 with a wavelength in the range of 200 to 900 nm to irradiate the surface of the amorphous silicon film therewith, whereby it is possible to achieve a laser annealing treatment in which the amorphous silicon film is efficiently heated and melted.

Figure 3:
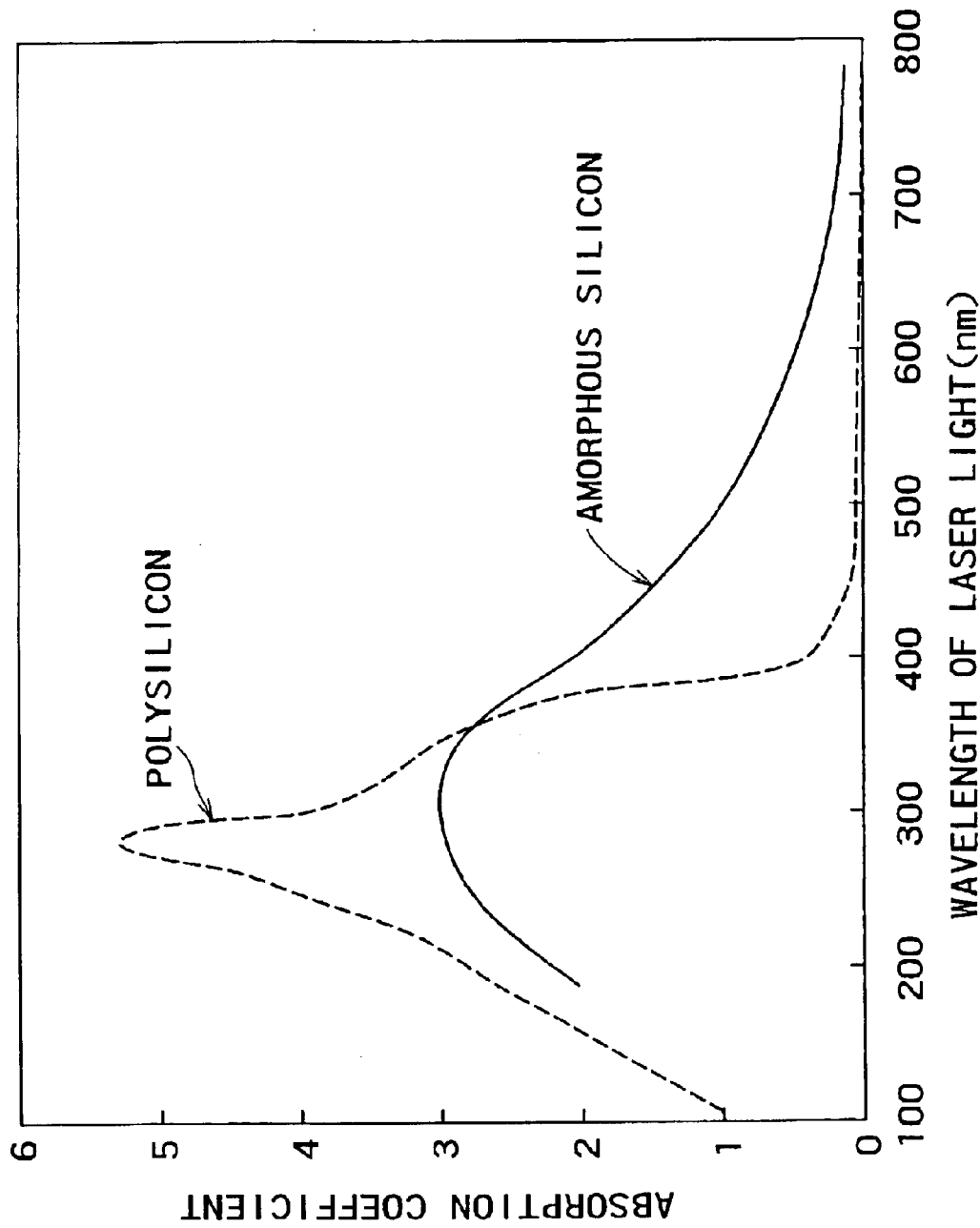
FIG. 3 is a characteristic diagram showing the relationship between wavelength of laser light and absorption coefficients of polysilicon and amorphous silicon.

Here, the results of measurement of absorption wavelength characteristics of polysilicon and amorphous silicon are shown in FIG. 3. In FIG. 3, the axis of abscissas represents the wavelength of laser light, and the axis of ordinates represents the absorption coefficient of each of polysilicon and amorphous silicon.

It is seen from the measurement results shown in FIG. 3 that peaks of the absorption wavelength of polysilicon and amorphous silicon are present in the vicinity of 300 nm. Particularly, it is seen that amorphous silicon has a sufficient absorption coefficient for laser light with a wavelength of about 400 nm which is used for the laser annealing treatment, and the laser light with a wavelength of about 400 nm can be efficiently absorbed by amorphous silicon.

By this, in the laser annealing apparatus 20, when the laser annealing treatment of silicon is performed by emitting the laser light 28 with a wavelength of about 400 nm from the semiconductor laser devices 22 and irradiating the surface of the amorphous silicon film with the laser light 28, the laser light 28 is not absorbed by, for example, atmospheric air, and the absorption coefficient of the amorphous silicon film for the laser light 28 is sufficiently high, so that it is possible to achieve a laser annealing treatment in which the amorphous silicon film is efficiently heated and melted.

In addition, in the laser annealing apparatus 20, the laser light 28 with a wavelength of about 400 nm used for the laser annealing treatment of silicon is absorbed, though slightly, also into polysilicon where amorphous silicon and polysilicon are momentarily coexistent upon heating and melting of the amorphous silicon film, so that both amorphous silicon and polysilicon can be simultaneously heated and melted. Therefore, in the laser annealing apparatus 20, by the laser annealing treatment using the laser light 28 with a wavelength of about 400 nm at the time of the laser annealing treatment of silicon, it is possible to uniformize the grain diameter of the crystal grains of the polysilicon film 6 formed through heating and melting of the amorphous silicon film.

While the TFT 1 is of the bottom gate structure comprising the gate electrode 3 on the lower side of the polysilicon film 6 in the embodiment as described above, this structure is not limitative, and, for example, a top gate structure comprising a gate electrode on the upper side of a polysilicon film may also be adopted.

In the case of uniformizing the light intensity of the laser light 28 radiated onto the surface of the amorphous silicon film, a constitution in which the plurality of semiconductor laser devices 22 are supported on the support base 23 so that the emitting portions 29 for emitting the laser light 28 are disposed parallel to the surface of the amorphous silicon film has been adopted in the embodiment as described above, this constitution is not limitative, and, for example, constitutions of the laser annealing apparatus as shown in FIGS. 4 to 8 may also be adopted. In the following description of the laser annealing apparatuses shown in FIGS. 4 to 8, the same or equivalent constitutions, portions and functions as or to those of the above-described laser annealing apparatus 20 will be denoted by the same symbols in the figures and description thereof will be omitted.

Figure 4:
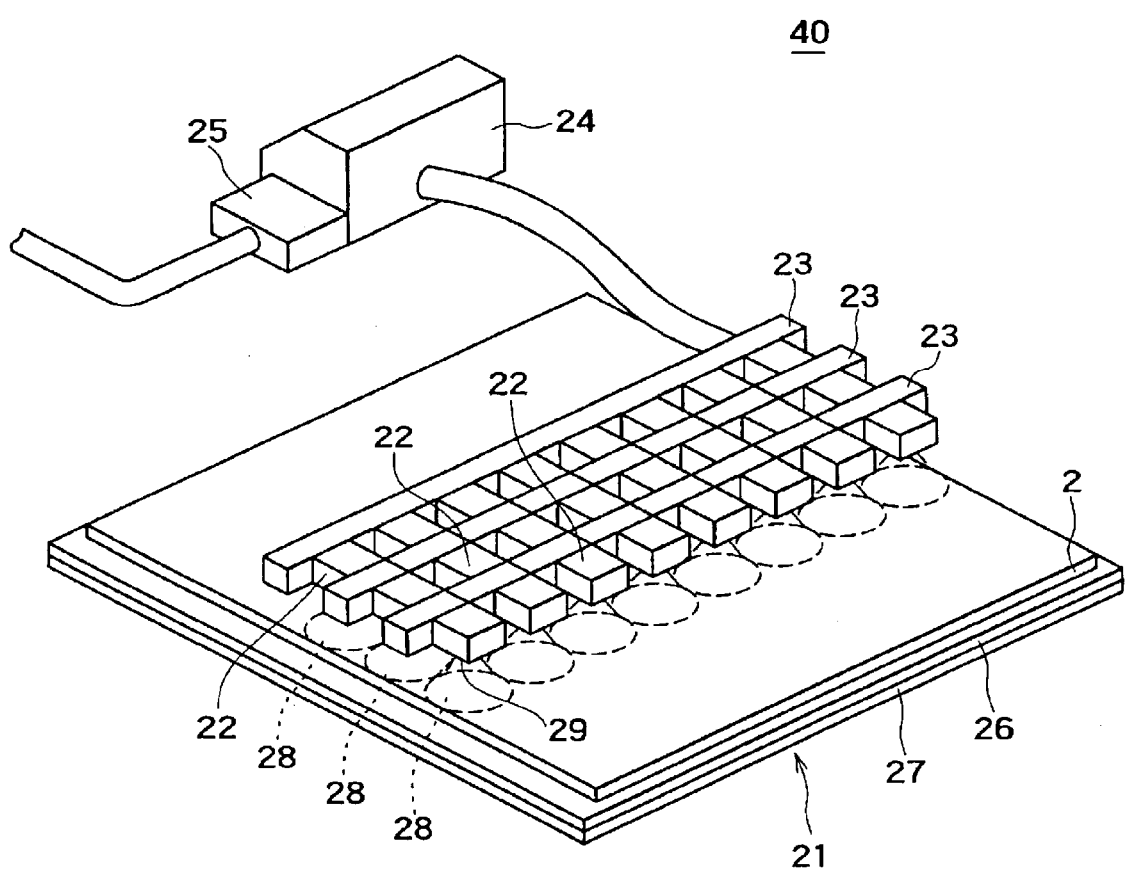
FIG. 4 is a general perspective view for illustrating another constitution of the laser annealing apparatus according to one embodiment of the present invention.

First, a laser annealing apparatus 40 shown in FIG. 4 will be described. The laser annealing apparatus 40 has a constitution in which a plurality of support bases 23 each for supporting a plurality of semiconductor laser devices 22 in series at predetermined intervals in parallel to the surface of an amorphous silicon film, on the upper side of a glass substrate 2, are arranged in a direction roughly orthogonal to the direction in which the plurality of semiconductor laser devices 22 are arranged.

In the laser annealing apparatus 40 constituted as above, at the time of uniformizing the light intensity of the laser light 28 radiated onto the surface of the amorphous silicon film, for example, the plurality of semiconductor laser devices 22 are supported on the support bases 23 so that emitting portions 29 for emitting the laser light 28 are disposed parallel to the surface of the amorphous silicon film, whereby the distances between the emitting portions 29 of the plurality of semiconductor laser devices 22 and the surface of the amorphous silicon film are made to be constant.

By this arrangement, in the laser annealing apparatus 40, the surface of the amorphous silicon film can be irradiated with the laser light 28 with stable light intensity, and a laser annealing treatment for heating and melting the amorphous silicon film without dispersion can be achieved.

In addition, in the laser annealing apparatus 40, the plurality of support bases 23 each for supporting the plurality of semiconductor laser devices 22 are arranged, so that the area of irradiation of the surface of the amorphous silicon film with the laser light 28 is enlarged. Also, for example, the region needing irradiation with the laser light 28 can be irradiated, at a stroke, with the laser light 28 uniformized in the light intensity of the laser light 28 radiated onto the surface of the amorphous silicon film. Therefore, the time required for the laser annealing treatment can be shortened, and productivity of the TFT 1 can be enhanced.

Figure 5:
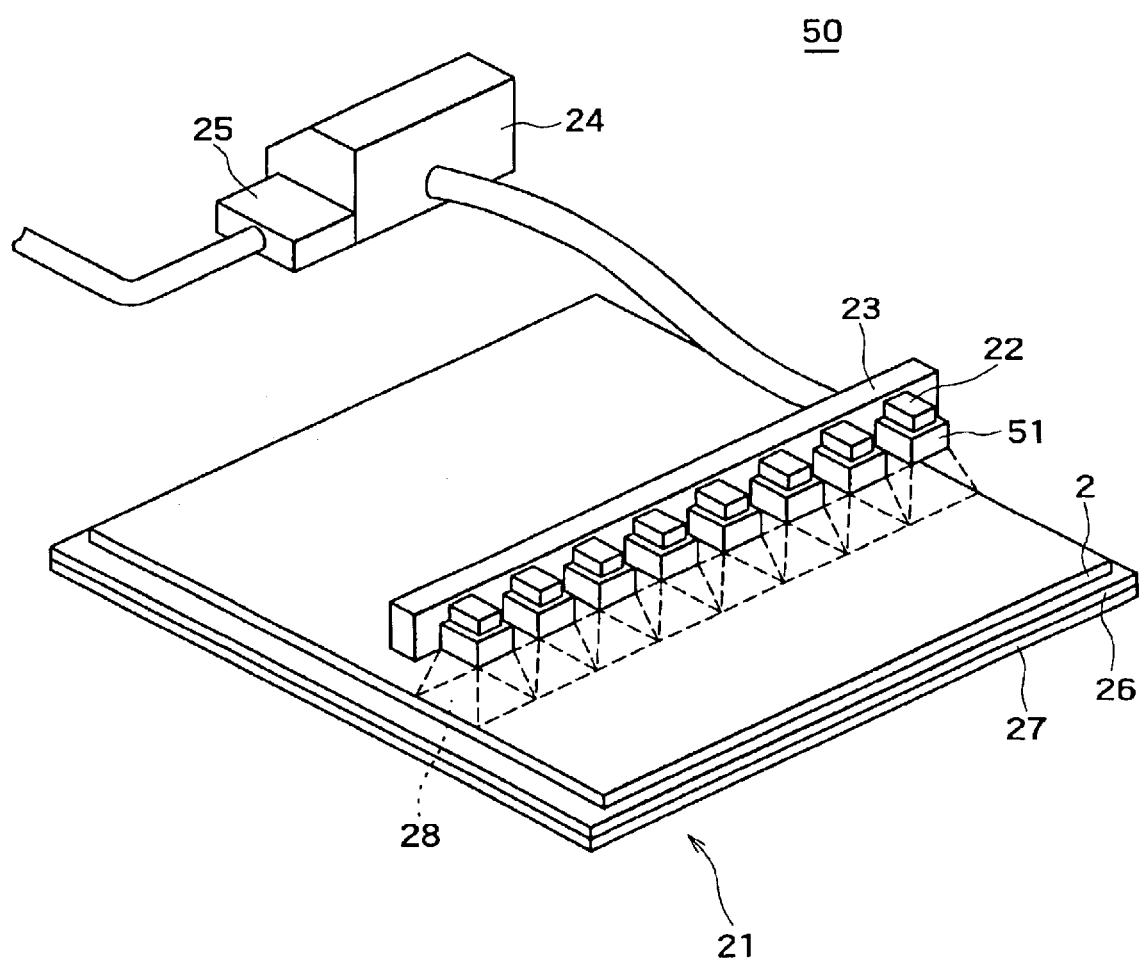
FIG. 5 is a general perspective view for illustrating a further constitution of the laser annealing apparatus.

Next, a laser annealing apparatus 50 shown in FIG. 5 will be described. The laser annealing apparatus 50 has a constitution in which optical devices 51 such as microlenses for forming the beam shape of laser light 28 to a predetermined shape are fitted respectively to emitting portions 29 for emitting the laser light 28 of a plurality of semiconductor laser devices 22. The optical device 51 forms the laser light 28 incident thereon from one main surface side thereof to a predetermined beam shape and emits it from the other main surface side thereof.

In the laser annealing apparatus 50 constituted as above, in uniformizing the light intensity of the laser light 28 radiated onto the surface of an amorphous silicon film, for example, the plurality of semiconductor laser devices 22 are supported on a support base 23 so that the main surfaces for emitting the laser light 28 of the optical devices 51 fitted to the plurality of semiconductor laser devices 22 are disposed parallel to the surface of the amorphous silicon film, whereby the distances between the main surfaces for emitting the laser light 28 of the optical devices 51 and the surface of the amorphous silicon film are made to be constant.

By this arrangement, in the laser annealing apparatus 50, the surface of the amorphous silicon film can be irradiated with the laser light 28 with stable light intensity, and a laser annealing treatment for heating and melting the amorphous silicon film without dispersion can be achieved.

In addition, in the laser annealing apparatus 50, the laser light 28 is formed into the predetermined beam shape by the optical devices 51, so that the laser light 28 uniformized in the light intensity of the laser light 28 radiated onto the surface of the amorphous silicon film can be radiated onto only a predetermined region of the amorphous silicon film. Therefore, needless irradiation with the laser light 28 can be omitted, so the productivity of the TFT 1 can be enhanced.

Figure 6:
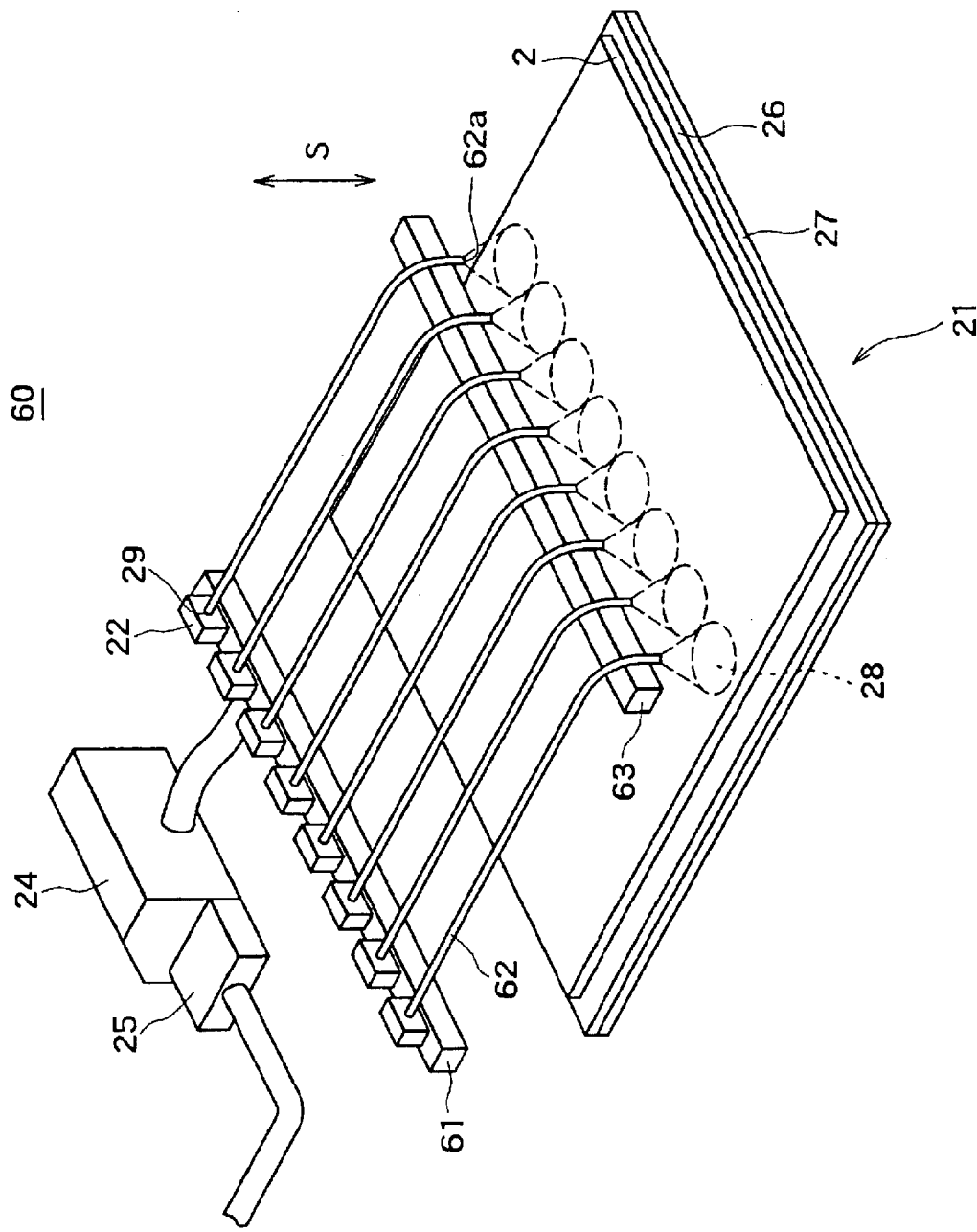
FIG. 6 is a general perspective view for illustrating still another constitution of the laser annealing apparatus.

Next, a laser annealing apparatus 60 shown in FIG. 6 will be described. This laser annealing apparatus 60 comprises a support base 61 for supporting a plurality of semiconductor laser devices 22 at a position spaced away from a moving stage 21, optical fibers 62 for guiding the laser light 28 emitted from the semiconductor laser devices 22, and an optical fiber support base 63 for supporting the optical fibers 62.

The support base 61 supports the plurality of semiconductor laser devices 22, in which emitting portions 29 for emitting the laser light 28 are directed in a predetermined direction, in series at predetermined intervals.

The optical fibers 62 are each in the form of a flexible thin line, one end side thereof are fitted respectively to emitting portions 29 for emitting the laser light 28 of the plurality of semiconductor laser devices 22, the laser light 28 emitted from the emitting portions 29 are guided through the inside of the thin lines, and the laser light 28 thus guided is emitted from emitting port portions 62a which are the other end side of the thin lines. In the optical fiber 62, the other end faces as the emitting port portions 62a are made to be, for example, in a convex form, whereby the emitted laser light 28 can be formed into a predetermined beam shape.

The optical fiber support base 63 supports portions near the emitting port portions 62a of the optical fibers 62 so that the emitting port portions 62a of the optical fibers 62 are opposed in parallel to the surface of the amorphous silicon film and that the emitting port portions 62a of the optical fibers 62 are arranged in series at predetermined intervals on the surface of the amorphous silicon film. In addition, the optical fiber support base 63 comprises a lift mechanism (not shown) for moving the supported optical fibers 62 up and down in the vertical direction indicated by arrows 5 in the figure relative to a moving stage 21. The lift mechanism is capable of regulating the distance between the emitting port portions 62a of the optical fibers 62 and the surface of the amorphous silicon film, so that the light intensity of the laser light 28 emitted from the emitting port portions 62a of the optical fibers 62 and radiated onto the surface of the amorphous silicon film can be varied.

In the laser annealing apparatus 60 constituted as above, in uniformizing the light intensity of the laser light 28 radiated onto the surface of the amorphous silicon film, for example, the portions near the emitting port portions 62a of the optical fibers 62 are supported by the optical fiber support base 63 so that the emitting port portions 62a of the optical fibers 62 fitted to the plurality of semiconductor laser devices 22 are disposed parallel to the surface of the amorphous silicon film, whereby the distances between the emitting port portions 62a of the optical fibers 62 and the surface of the amorphous silicon film are made to be constant.

By this arrangement, in the laser annealing apparatus 60, the surface of the amorphous silicon film can be irradiated with the laser light 28 with stable light intensity, and a laser annealing treatment for heating and melting the amorphous silicon film without dispersion can be achieved.

In addition, in the laser annealing apparatus 60, the optical fibers 62 are flexible, and the position of irradiating the amorphous silicon film with the laser light 28 can be easily varied, so that the region and position of irradiation with the laser light 28 can be easily controlled according to the size of the amorphous silicon film.

Figure 7:
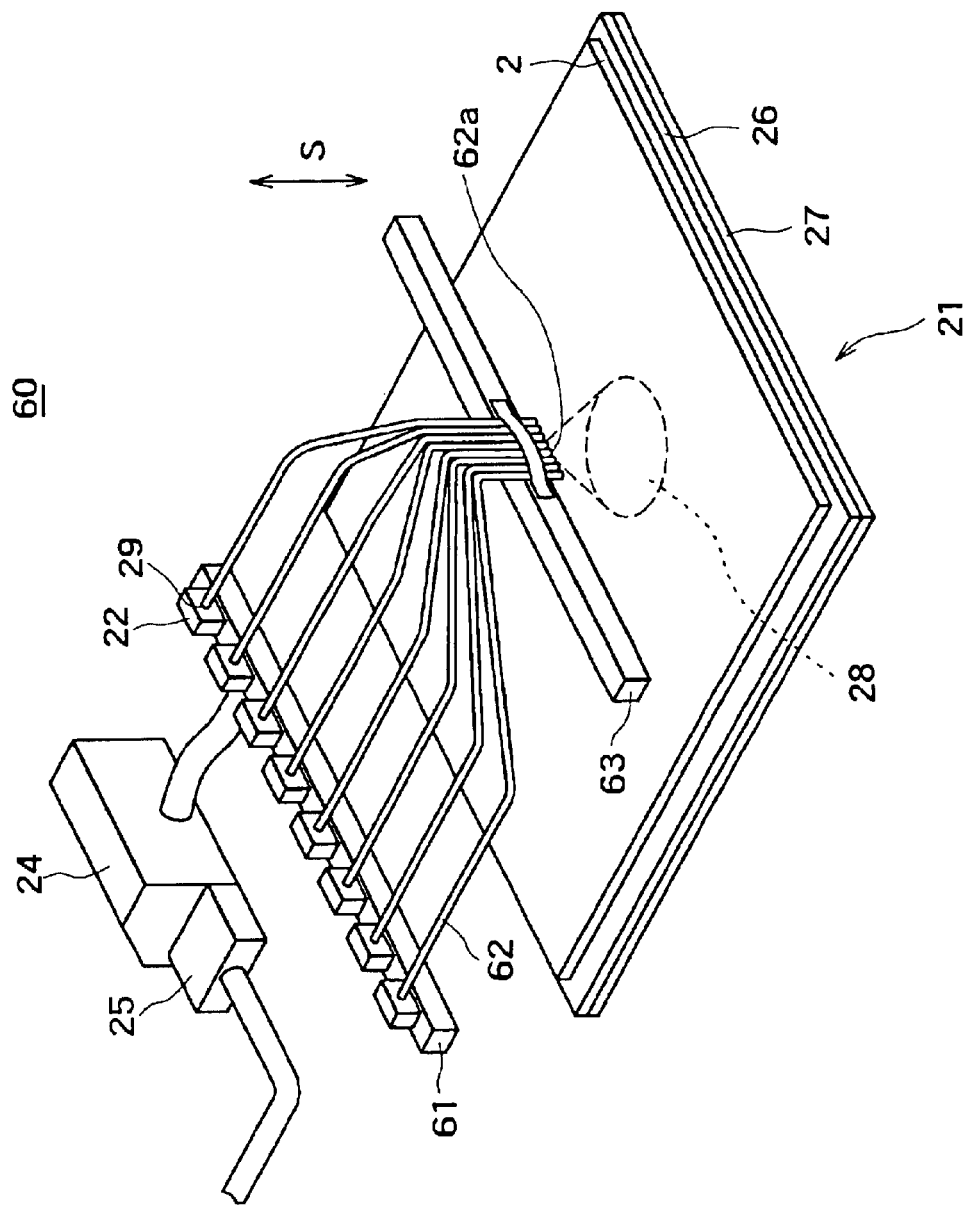
FIG. 7 is a general perspective view for illustrating a still further constitution of the laser annealing apparatus.

Further, in the laser annealing apparatus 60, the optical fibers 62 can be supported by the optical fiber support base 63 in the condition where portions near the emitting port portions 62a of the optical fibers 62 are bundled, as shown in FIG. 7. In this case, in the laser annealing apparatus 60, the laser light 28 emitted from the emitting port portions 62a of the optical fibers 62 can be radiated only onto a predetermined region of the amorphous silicon film, whereby needless irradiation with the laser light 28 can be omitted, and productivity of the TFT 1 can be enhanced.

Furthermore, in the laser annealing apparatus 60, for example, the semiconductor laser devices 22 can be disposed remote from the glass substrate 2, so that component parts and the like can be easily replaced.

Figure 8:
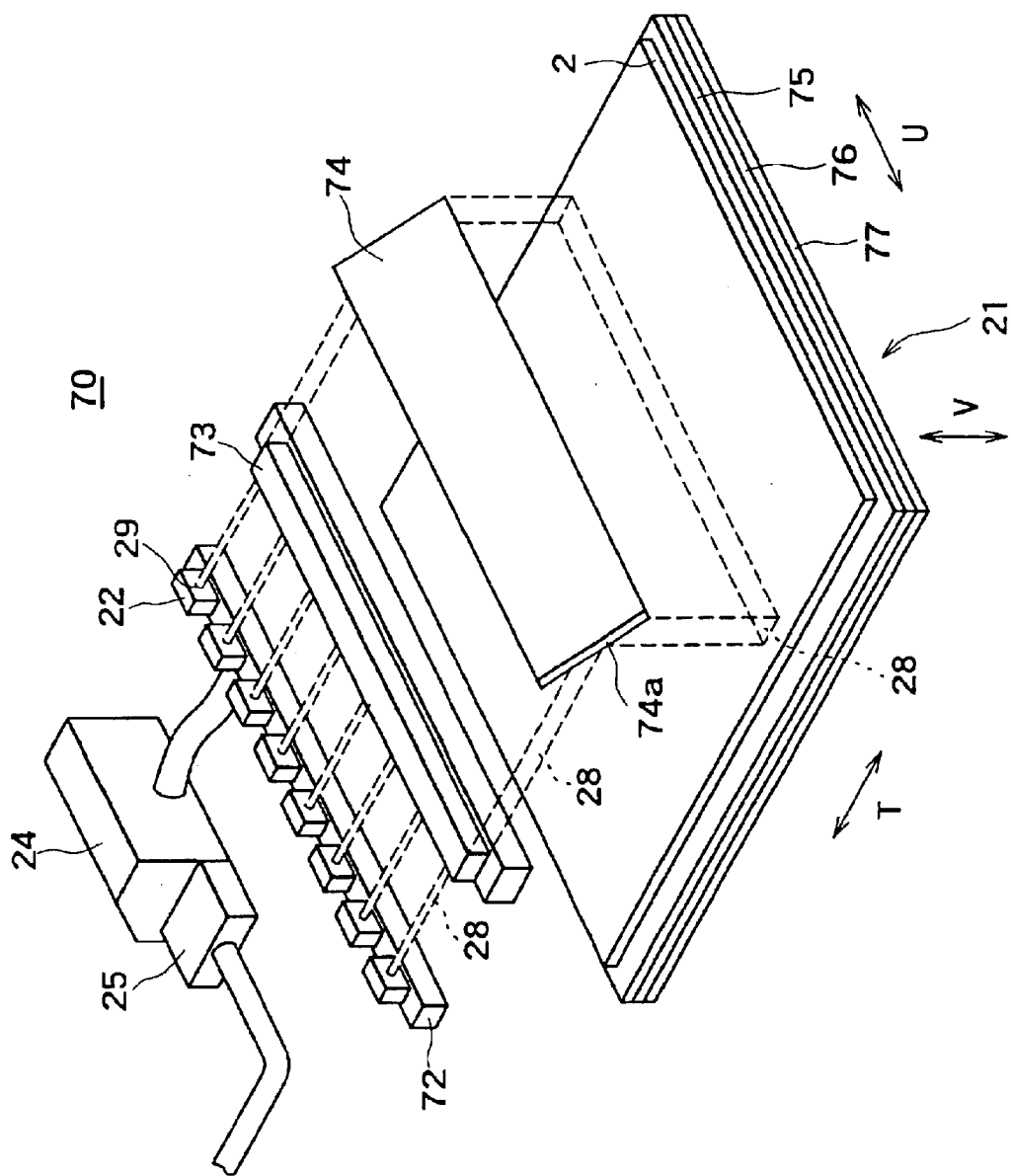
FIG. 8 is a general perspective view for illustrating another constitution of the laser annealing apparatus.

Next, a laser annealing apparatus 70 shown in FIG. 8 will be described. The laser annealing apparatus 70 comprises a moving stage 71 for mounting a glass substrate 2 thereon, a support base 72 for supporting a plurality of semiconductor laser devices 22 at a position remote from the moving stage 71, an optical device 73 for forming the laser light 28 emitted from the semiconductor laser devices 22 into a predetermined beam shape, and a reflector 74 for reflecting the laser light 28 transmitted through the optical device 73 onto the surface of the amorphous silicon film.

The moving stage 71 is high in flatness of its-main surface on which to mount the glass substrate, and has the function of moving the glass substrate 2 mounted thereon to a position for the laser annealing treatment and the function of fixing the glass substrate 2.

In concrete, the moving stage 71 comprises an X stage 75, a Y stage 76, a Z stage 77, and a sucker mechanism which is not shown. The X stage 75 and the Y stage 76 are stages for horizontally moving the moving stage 71 in directions of arrows T and arrows U in the figure in the plane of the main surface thereof, thereby moving the mounted glass substrate 2 in mutually roughly orthogonal directions and guiding the glass substrate 2 to a position for the laser annealing treatment. The Z stage 77 is a stage capable of moving in the vertical direction indicated by arrows V in the figure relative to the mounted glass substrate 2, thereby regulating the height of the moving stage 71. By this arrangement, with the Z stage 77, the light intensity of the laser light 28 reflected by the reflector 74 and radiated onto the surface of the amorphous silicon film can be varied. The sucker mechanism is for fixing the glass substrate 2 by sucking the glass substrate 2 onto the main surface of the moving stage 71.

The support base 72 supports the plurality of semiconductor laser devices 22 in the condition where the plurality of semiconductor laser devices 22 with the emitting portions 29 for emitting the laser light 28 directed in a predetermined direction are arranged in series at predetermined intervals.

The optical device 73 is an optical mechanism, for example, a beam homogenizer, on which the laser light 28 emitted from the plurality of semiconductor laser devices 22 is incident from one main surface side thereof, and from which the laser light 28 is emitted from the other main surface side in the state of being formed into a predetermined beam shape.

The reflector 74 has a reflective surface 74a for reflecting the laser light 28 formed into the predetermined beam shape by the optical device 73. The reflector 74 is disposed on the upper side of the surface of the amorphous silicon film so that the position of impingement of the laser light 28 on the reflective surface 74a is parallel to the surface of the amorphous silicon film. By this arrangement, with the reflector 74, the laser light 28 formed into the predetermined beam shape by the optical device 73 can be reflected so as to be radiated onto the surface of the amorphous silicon film.

In the laser annealing apparatus 70 constituted as above, in uniformizing the light intensity of the laser light 28 radiated onto the surface of the amorphous silicon film, for example, the position of impingement of the laser light 28 on the reflective surface 74a is set parallel to the surface of the amorphous silicon film, whereby the distance between the position of impingement of the laser light 28 on the reflective surface 74a and the surface of the amorphous silicon film is made to be constant.

By this arrangement, in the laser annealing apparatus 70, the surface of the amorphous silicon film can be irradiated with the laser light 28 with stable light intensity, and a laser annealing treatment for heating and melting the amorphous silicon film without dispersion can be achieved.

In addition, in the laser annealing apparatus 70, for example, the semiconductor laser devices 22, the optical device 73 and the like can be disposed remote from the glass substrate 2, so that these component parts can be easily replaced.

The laser annealing apparatuses with various constitutions as described above in the embodiments of the present invention are not limited to the above-described constitutions. For example, a constitution in which the optical fibers and the optical device are used joint may be adopted.

What is claimed is:

1. A method of fabricating a thin film transistor, comprising:
    forming an amorphous silicon film as a layer secured to a substrate,
    subjecting said amorphous silicon film to an annealing treatment to thereby convert said amorphous silicon film into a polycrystalline silicon film, and
    fabricating said thin film transistor in a predetermined region with said polycrystalline silicon film as an active layer,
    wherein in said annealing treatment, a laser annealing apparatus comprising a plurality of individual original semiconductor laser sources for emitting laser light are used for irradiating corresponding portions of the surface of said amorphous silicon film with substantially uniform laser light.

2. A method of fabricating a thin film transistor as set forth in claim 1, wherein said plurality of individual original semiconductor laser sources are substantially uniformly spaced above said surface of said amorphous silicon film.

3. A method of fabricating a thin film transistor as set forth in claim 1, wherein
    an optical device guides said laser light emitted from said plurality of individual original semiconductor laser sources has an emitting port for emitting said guided laser light in a predetermined direction, and
    said optical device is disposed such that said emitting port and said surface of said amorphous silicon film are opposed to each other.

4. A method of fabricating a thin film transistor as set forth in claim 1, wherein
    an optical device which transmits there through said laser light emitted from said plurality of individual original semiconductor laser sources is utilized to thereby alter a beam shape of said laser light into a predetermined shape and further wherein the optical device has an emitting port for emitting said laser light with said predetermined beam shape in a predetermined direction, and
    said optical device is disposed such that said emitting port and said surface of said amorphous silicon film are opposed to each other.

5. A method of fabricating a thin film transistor as set forth in claim 1, wherein
    an optical device for reflecting said laser light emitted from said plurality of individual original semiconductor laser sources in a predetermined direction is disposed above said surface of said amorphous silicon film.

6. A method of fabricating a thin film transistor according to claim 1, wherein laser light from the plurality of original laser sources is transmitted to the surface of the amorphous silicon film with a means for making the laser light substantially uniform from each of the plurality of semiconductor lasers.

* * * * *